United States Patent [19]

Maniar

[11] Patent Number: 5,258,093
[45] Date of Patent: Nov. 2, 1993

[54] PROCSS FOR FABRICATING A FERROELECTRIC CAPACITOR IN A SEMICONDUCTOR DEVICE

[75] Inventor: Papu D. Maniar, Austin, Tex.

[73] Assignee: Motorola, Inc., Schaumburg, Ill.

[21] Appl. No.: 993,986

[22] Filed: Dec. 21, 1992

[51] Int. Cl.$^5$ .............................................. H01L 21/00
[52] U.S. Cl. ..................................... 156/626; 156/651; 156/652; 156/656; 156/664; 252/79.2; 252/79.3; 134/3; 134/41
[58] Field of Search ............... 156/652, 651, 656, 664, 156/626; 252/79.2, 79.3; 134/3, 41

[56] References Cited

U.S. PATENT DOCUMENTS 5,164,808 11/1992 Evans, Jr. et al. .................. 361/305
5,189,594 2/1993 Hoshiba .............................. 257/295
5,206,788 4/1993 Larson et al. ................... 29/25.42 X

OTHER PUBLICATIONS

Trolier, et al., "Etched Piezoelectric Structures", IEEE Proceedings International Symposium on Applications of Ferroelectrics, 1986, pp. 707-710.
Toyama, et al., "Crack-Free PZT Thin Films Micropatterned On Silicon Substrate For Integrated Circuits", ISIF 3rd Int. Sym. Integ. Ferroelectrics, Apr. 3-5, 1991, pp. 444-447.
Rod, "Process Issues in the Development of a Ferroelectric Capacitor/CMOS Test Chip" Rep. No. HDL--PR-91-2, Dec., 1991, U.S. Army Laboratory Command, Adelphi, Md.

Primary Examiner—Thi Dang
Attorney, Agent, or Firm—Jasper W. Dockrey

[57] ABSTRACT

An etching process for the patterning of electrodes and a ferroelectric dielectric layer in a ferroelectric capacitor, which is formed in a semiconductor device, is disclosed. A series of overlying layers including a first electrode layer (16), a ferroelectric layer (18), and a second electrode layer (20) are etched to form a ferroelectric capacitor (14) on a semiconductor substrate (10). The second electrode layer (20) is selectively etched in a first aqueous solution containing hydrochloric acid, nitric acid, and a metal etching compound comprised of phosphoric acid, nitric acid, and acetic acid. The ferroelectric layer (18) is selectively etched in a second aqueous solution containing hydrogen peroxide, hydrofluoric acid, and nitric acid. The etch rate of the ferroelectric layer in the second aqueous solution is controlled by selection of the relative concentration of the chemicals used to form the solution. The wet chemical etching process of the invention can be combined with a dry etching process for the purpose of removing dry etch residue following formation of the ferroelectric capacitor (14).

13 Claims, 2 Drawing Sheets

PROCSS FOR FABRICATING A FERROELECTRIC CAPACITOR IN A SEMICONDUCTOR DEVICE

RELATED APPLICATION

Related material is disclosed in co-pending, commonly assigned patent application Ser. No. 07/993,987 filed concurrently herewith.

FIELD OF THE INVENTION

This invention relates in general to a method for fabricating a semiconductor device, and more particularly to a method of fabricating a ferroelectric capacitor.

BACKGROUND OF THE INVENTION

As the overall dimensions of semiconductor devices continue to shrink, the demand is ever increasing for devices having large charge storage capacity. The need for large charge storage capacity remains even though individual components are scaled to smaller dimensions. As the surface area of a component, such as a capacitor is reduced, a corresponding reduction in charge storage capability occurs. The smaller surface area available for components, such as transistors, capacitors, and the like, coupled with the requirement to maintain high charge storage levels has led researchers in the field of fabrication science to seek new materials from which to construct the components. The use of ferroelectric materials eliminates the need for the large surface-area capacitors typically used to store a static electric charge. One group of promising new ferroelectric materials is the family of PZT ceramic dielectrics. The PZT dielectrics have ferroelectric compounds including lead (Pb), zirconium (Zr), and titanium (Ti) oxides; hence the acronym "PZT."

While ferroelectric materials offer a means to obtain high charge storage density, PZT materials possess characteristics that make the integration of a ferroelectric capacitor into a semiconductor device difficult. For example, in the construction of a ferroelectric capacitor using a PZT material, an electrode material is selected, so that it does not chemically react with the PZT material during processing. An unwanted chemical reaction between an electrode material and the PZT can destroy the ferroelectrical properties of the ferroelectric capacitor. The requirement of non-reactivity limits the selection of materials that can be used to form the electrode plates of a ferroelectric capacitor. One suitable electrode material is platinum. Platinum possesses the desired degree of electrical conductivity and does not significantly react with ferroelectric materials, such as PZT. However, platinum is difficult to etch. An ion milling process may be used to define high resolution features from a blanket platinum layer. An etching mask is defined on the platinum surface and an energetic stream of ions bombards the exposed platinum surface. While ion milling can be used to from patterns in a platinum layer, the ion milling process is typically not selective to many masking materials and to layers underlying the platinum layer. The ion milling process removes most materials at about the same rate making control of the process difficult.

The successful fabrication of a ferroelectric capacitor also requires high-resolution patterning capability of the PZT layer. Ion milling processes are unable to etch PZT with sufficient selectivity to other materials. A wet etching process is disclosed in U.S. Pat. No. 4,759,823 to D. Asselanis, et al. The etch includes a two-step process, wherein the first step etches a PZT layer and the second step removes lead residue from the substrate surface once the PZT is removed. Although this method is effective in removing PZT, the etch rate of the first etch step is high and endpoint determination is difficult. In addition, the second step is inefficient and can result in leaching lead from the PZT material underlying the photoresist layer.

SUMMARY OF THE INVENTION

In practicing the present invention, there is provided a process for the fabrication of a ferroelectric capacitor in a semiconductor device. In one embodiment, a substrate is provided having a first electrode layer disposed thereon. A ferroelectric layer overlies the first electrode layer and a second electrode layer overlies the ferroelectric layer. The second electrode layer is selectively etched in a first aqueous solution containing hydrochloric acid, nitric acid, and a metal etching compound comprising phosphoric acid, nitric acid, and acetic acid. The first aqueous solution does not substantially etch the ferroelectric layer underlying the second electrode layer. The ferroelectric layer is selectively etched in a second aqueous solution containing hydrogen peroxide, hydrofluoric acid, and nitric acid. The second etch solution does not substantially etch the first electrode layer.

Figure 1:
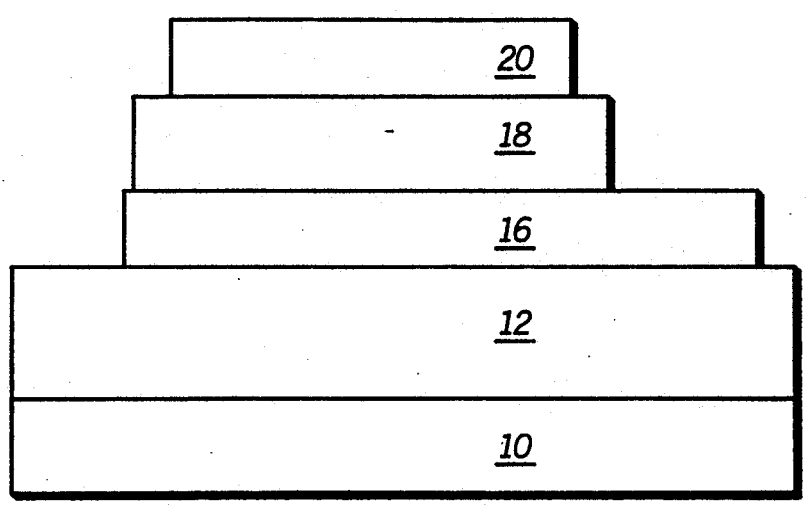
FIG. 1, illustrates, in cross section, a ferroelectric capacitor structure fabricated in accordance with the process of the present invention.
Figure 3:
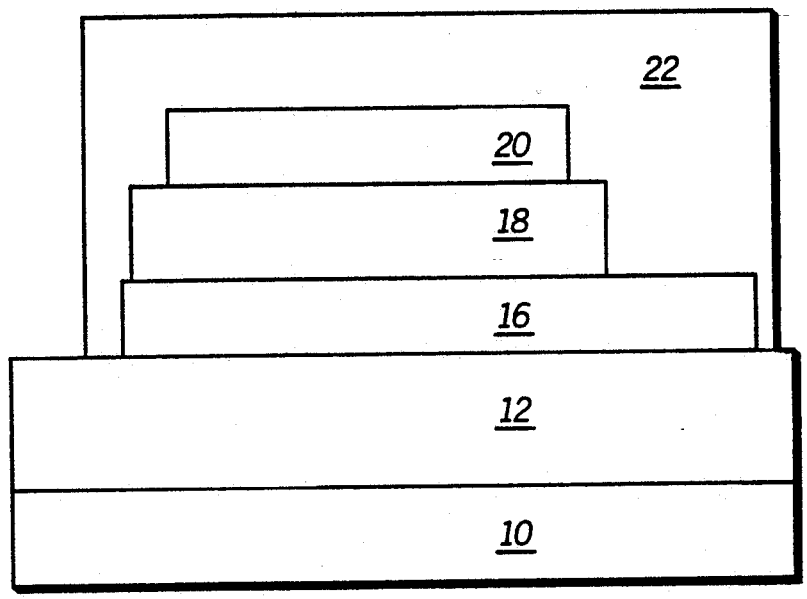
FIG. 3 illustrates, in cross section, a substrate cleaning process in accordance with the present invention.

It is appreciated that for simplicity and clarity of illustration elements shown in FIGS. 1 and 3 have not necessarily been drawn to scale. For example, the dimensions of some of the elements may be exaggerated relative to each other for clarity.

DETAILED DESCRIPTION OF PREFERRED EMBODIMENTS

The present invention includes a process using chemical etching processes to fabricating a ferroelectric capacitor. The fabrication of a ferroelectric capacitor requires the use of processes that are capable of etching the materials used to form the capacitor plates and the intermediate ferroelectric dielectric layer. Each of the etching steps of the etching processes must meet several process requirements. These requirements include etching an exposed portion of a layer, which is desired to be etched, 1) in a substantially uniform manner, 2) at a controllable etch rate, and 3) selectively to an underlying layer. Because the materials forming both the dielectric layer and the electrode plates vary in composition, the same etching chemistry cannot be used for all of the etching steps. In addition to having the capability to etch a specific layer, a particular etching step must also not significantly etch a layer lying immediately below the specific layer that being etched. Therefore, the successful fabrication of a ferroelectric capacitor requires that an etching process include individual etching steps for each layer to be etched.

An example of a ferroelectric capacitor structure, which can be used in a semiconductor device, is illustrated in FIG. 1. A semiconductor substrate 10 supports a buffer layer 12 and a ferroelectric capacitor 14 that lies on buffer layer 12. Ferroelectric capacitor 14 includes a first electrode 16 over buffer layer 12, a ferroelectric dielectric layer 18 over first electrode 16, and a second electrode 20 over dielectric layer 18. Ferroelectric capacitor 14 can be one component of a complex integrated circuit, such as a nonvolatile random access memory device (NVRAM), or a dynamic-random-access memory (DRAM) device, and the like.

In one embodiment, buffer layer 12 is a refractory-metal oxide, and first and second electrodes 16 and 20 are platinum. Dielectric layer 18 is a ferroelectric material such as lead titanate ($PbTiO_3$), lead zirconium titanate "PZT" ($Pb(Zr, Ti)O_3$), and lead lanthanum zirconium titanate "PLZT" ($(Pb, La)(Zr, Ti)O_3$), which is deposited to a thickness of about 1500 angstroms. As used herein, the chemical representation (X, Y) indicates these elements can be present in varying stoichiometric amounts.

Dielectric layer 18 is formed by a spin-coating process using a sol-gel solution. After the sol-gel solution is spun onto the substrate, the coated substrate is preferably thermally treated in an oxygen-containing ambient at about 250° to 350° C., for about one to ten minutes. Alternatively, a rapid thermal annealing process can be used. In addition, the baking can be performed on a heated plate, or alternatively, in a convection oven. The bake drives off residual solvent leaving an amorphous PZT film on the substrate surface. Next, a sintering process is performed to further interdiffuse the metals and form a perovskite PZT thin-film. The sintering process can be performed in either a standard diffusion furnace or in an atmospheric oven. The sintering process is performed in an oxygen-containing ambient at a temperature of about 550° to 650° C. for about 5 to 60 minutes. Alternatively, the sintering process can be performed by rapid thermal annealing at a temperature of about 600° to 750° C. for a time period ranging from about 2 seconds to about 5 minutes.

While the structure illustrated in FIG. 1 is representative of a typical ferroelectric capacitor, those skilled in the art appreciate that other structural variations are possible. The structure shown in FIG. 1 is general in nature and is meant illustrate the process of the invention.

Fabrication of capacitor 14 in an integrated circuit, which typically includes many other components, such as transistors and the like, requires that first and second electrodes 16 and 20 and dielectric layer 18 be formed in a predetermined configuration. Using standard semiconductor fabrication methods, layers are formed into specific configurations. First photoresist mask is formed over a layer. The underlying layer is then etched and the photoresist mask is removed. In the fabrication of a ferroelectric capacitor, such as capacitor 14, the layers can be etched sequentially using the same photoresist mask, or alternatively, different photoresist masks can be used for each layer. In addition, in cases where the etch process does not attack the material composition of a particular overlying layer, that layer can be used as a "hard mask" and the underlying layer can be etched to have about the same configuration as the hard mask.

In one embodiment of the invention, platinum layers 16 and 20 are etched using a wet etching solution. A photoresist layer is coated on the surface of the platinum, and then the photoresist is developed to form a patterned photoresist layer. The patterned photoresist layer is subsequently treated in an oxygen plasma to remove any organic residue remaining on the exposed areas of the platinum surface. The plasma process is known in the art as a descum process and is performed for a brief period of time, usually not exceeding two minutes. To avoid the oxidation of the platinum surface, it is important that the descum process not be extended for more than two minutes. An oxide layer on the surface of the platinum film reduces the etching rate of the platinum layer.

After the descum process, substrate 10 is placed in a platinum cleaning solution. The cleaning solution comprises hydrogen peroxide and deionized water. The solution contains preferably about 3 to 12 weight % hydrogen peroxide, and most preferably 6.7 weight % hydrogen peroxide, and the remainder deionized water. During the cleaning process, the cleaning solution is preferably maintained at a temperature of about 30° to 50° C., and most preferably about 40° C. The cleaning solution oxidizes impurities remaining on the surface of the platinum, and including those impurities located near the edge of the photoresist pattern. Following the platinum surface treatment, substrate 10 is rinsed with deionized water.

In accordance with the present invention, the platinum layer is etched in a platinum etching solution. The platinum etching solution contains hydrochloric acid, nitric acid, and a metal etching solution. The metal etching solution is commercially available from Olin Hunt Specialty Products Inc. of West Paterson, N.J. and is known by the trade designation "M2S." The metal etching solution contains 60–80 weight % phosphoric acid, 10–25 weight % acetic acid, 0.1–5.0 weight % nitric acid, and remainder water. In a preferred embodiment, a first solution is prepared in an etch bath, wherein the first solution contains about 12.6 to 26.1 weight % hydrochloric acid, and about 4.2 to 11.4 weight % nitric acid, with the remainder deionized water. In the most preferred embodiment, first solution contains 20.9 weight % hydrochloric acid, and 6.7 weight % nitric acid, with the remainder deionized water. The first solution is heated to about 75° C. and metal etching solution is added while maintaining the bath temperature at about 70° to 80° C. to form the platinum etching solution. Following the addition of the metal etching solution, the platinum etching solution preferably contains about 5 to 12 weight % metal etching solution, about 12 to 23 weight % hydrochloric acid, about 4 to 10 weight % nitric acid, and the remainder water. In the most preferred embodiment the platinum etching solution contains 8.0 weight % metal etching solution, 19.2 weight % hydrochloric acid, and 6.2 weight % nitric acid, and the remainder water. After preparation, the platinum etching solution is stabilized for about 10 to 30 minutes prior to use. The platinum etch solution is prepared from reagent grade solutions of hydrochloric acid (35 weight %), nitric acid (70 weight %), and commercially supplied M2S metal etching solution.

Substrate 10 is immersed in the etch bath and the platinum is etched while maintaining the bath temperature at about 70° to 80° C. The etch rate of the platinum film in the platinum etch solution can be monitored by periodically measuring the sheet resistance of the platinum film. In one embodiment of the present invention, a platinum layer having an overlying photoresist pattern is removed at about 700 to 800 angstroms per minute. The platinum etch solution does not substantially etch organic photoresist. This is an important aspect of the present invention because the formation of a high resolution platinum pattern depends on the preservation of the photoresist mask. In the absence of an overlying photoresist mask, the platinum etch rate is about 1300 to 1500 angstroms per minute. The platinum etch solution does not substantially etch the underlying ferroelectric layer or buffer layer 12.

Once the platinum layer is etched to form second electrode 20, further processing requires etching the dielectric layer 18 that forms the dielectric of the ferroelectric capacitor 14. In one embodiment of the invention, a photoresist mask is defined on first electrode layer 20 and on a portion of the ferroelectric layer. Dielectric layer 18 is then etched at a controlled etch rate in a dielectric etching solution which is selective to both platinum and the photoresist mask.

In accordance with the invention, the dielectric etching solution contains nitric acid, hydrofluoric acid, hydrogen peroxide, and water. In a preferred embodiment, the dielectric etching solution contains about 0.02 to 0.7 weight % hydrofluoric acid, 1 to 5 weight % nitric acid, 0 to 50 weight % hydrogen peroxide, and the remainder deionized water. In the most preferred embodiment, dielectric etching solution contains about 0.04 weight % hydrofluoric acid, 1.43 weight % nitric acid, 14.8 weight % hydrogen peroxide, and the remainder deionized water. Following preparation, the solution is stirred and used immediately. The dielectric etching solution is prepared using reagent grade solutions of nitric acid (70 weight %), hydrofluoric acid (49 weight %), and hydrogen peroxide (31 weight %).

The patterned ferroelectric layer is placed in the dielectric etching solution and the etching reaction begins. An important feature of the dielectric etch process of the invention is the uniform and controlled selective etching of the ferroelectric layer provided by the dielectric etching solution. At room temperature, the dielectric etching solution removes a PZT ferroelectric layer at about 750 to 1500 angstroms per minute depending upon the annealing method used the crystallize the PZT film. The higher etch rate is obtained when the PZT film is annealed by rapid thermal annealing, and the lower etch rate is obtained when the PZT film is annealed in a conventional annealing furnace.

An additional feature is the ability of the dielectric etching solution to remove chemical residue simultaneously with the dielectric film. A chemical residue can develop on the platinum surface from un-solubilized components of the ferroelectric material. For example, in the case of PZT ferroelectric materials, excess lead oxide can precipitate on the platinum surface underlying the PZT layer. The process of the present invention advantageously removes the lead oxide from the surface of the platinum in a single etching step.

As the etching proceeds, portions of the underlying platinum layer become exposed to the etch solution. When the etching solution comes in contact with the platinum surface, the hydrogen peroxide in the solution undergoes a catalytic decomposition to gaseous reaction products. The decomposition reaction produces vigorous bubbling in the solution as gases are produced at the platinum surface. Accordingly, the initiation of bubbling in the solution indicates the endpoint of the etching process. The hydrogen peroxide decomposition reaction provides a convenient in-situ method of endpoint detection without the need to use sophisticated endpoint detection equipment. In a process for the removal of a ferroelectric layer that lies over a platinum layer, the ability to easily and reliably detect the endpoint of the dielectric etch process is a distinct advantage of the present invention.

Following the etching of the ferroelectric layer, the photoresist mask can be removed and another photoresist mask can be formed prior to etching the underlying platinum layer. Alternatively, the original photoresist mask can be retained and the platinum etching solution described above can be used to etch the platinum layer underlying the ferroelectric layer. In the alternative case, first electrode 16, illustrated in FIG. 1, will have about the same dimensions as dielectric layer 18. In another alternative, first electrode 16 can be fully configured prior to the deposition of the ferroelectric layer and the second platinum layer. In this case, capacitor 14 is completely fabricated after etching the ferroelectric layer. All such process variations for the formation of ferroelectric capacitor 14 are within the scope of the present invention.

Without further elaboration and using the preceding description, one skilled in the art can utilize the invention to its fullest extent. Therefore, the following preferred specific embodiments are to be construed as merely illustrative, and not limiting in any way whatsoever.

EXAMPLE I

A titanium dioxide film about 1750 angstroms thick was deposited onto a silicon substrate. After depositing the titanium dioxide film, the substrate was placed in a sputter deposition apparatus and a 1000 angstrom thick platinum film was sputter deposited onto the titanium dioxide film. The sputter deposition was performed using a pure platinum target and 400 watts of radio-frequency power in an argon atmosphere at eight millitorr chamber pressure.

An aqueous platinum etch solution was prepared from reagent grade hydrochloric acid obtained from a 35 weight % solution, reagent grade nitric acid obtained from a 70 weight % solution, and a commercial metal etching solution. The metal etching solution has been previously described. A first solution was prepared in an etch bath using 3500 milliliters hydrochloric acid, 500 milliliters of nitric acid, and about 2500 milliliters of water. The first solution was heated to about 75° C., and 400 milliliters of metal etch solution was added while maintaining the bath temperature at about 70° to 80° C. After the addition of the metal etching solution, the platinum etch solution contained 8.0 weight % metal etching solution, 19.2 weight % hydrochloric acid, and 6.2 weight % nitric acid, with the remainder deionized water. Following preparation, the platinum etch solution was stabilized for about 20 minutes prior to use.

Figure 2:
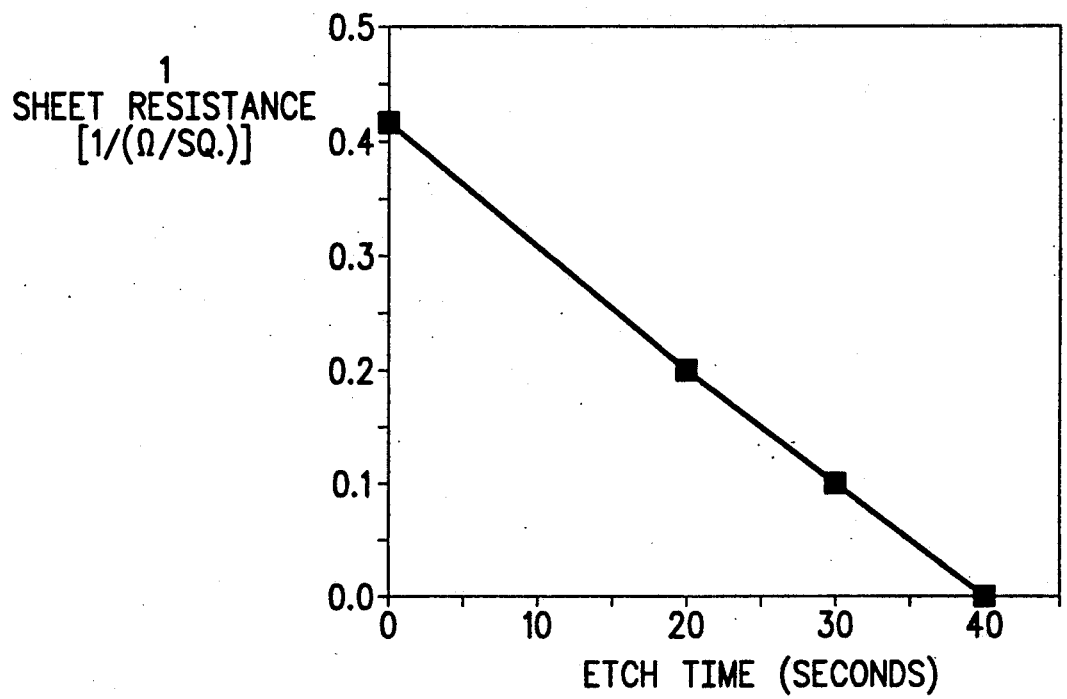
FIG. 2 is a plot of the inverse of sheet resistance of a platinum film as a function of etching time in accordance with the invention.

In preparation for etching, the initial sheet resistance of the blanket platinum film was measured using a four point probe. The substrate was then placed in the etch bath while maintaining the bath temperature at 70° to 80° C. The substrate was removed after 20 seconds and washed in deionized water then dried in nitrogen purged spin-dryer. The average sheet resistance of the partially etched platinum film was measured with a four-point probe. After four-point probe measurement, the substrate was returned to the bath and etched for an additional ten seconds. Again the substrate was washed, dried, and the average sheet resistance measured. This procedure was repeated until all of the platinum film was etched away from the surface of the substrate. The sheet resistance data is plotted as a function of etching time in FIG. 2. In this example, the platinum etch rate was calculated to be 1500 angstroms per minute.

EXAMPLE II

A series of silicon substrates were prepared having a PZT film over a platinum layer. Each PZT film was prepared by spin-coating a sol-gel solution onto the platinum film. Following spin-coating, the PZT films were oven-dried in air at 300° C. for one minute. Each PZT film was sintered in a rapid thermal annealing apparatus for two minutes at about 700° C. The thickness of the each PZT film was about 1500 angstroms. A photoresist pattern was then formed on each substrate using a positive-acting, novalac-resin photoresist.

Two etching solutions were prepared having varying the amounts of hydrogen fluoride (49 weight % solution), hydrogen peroxide (31 weight % solution), nitric acid (70 weight % solution), and deionized water as noted below.

TABLE I

|  | Solution 1 (weight %) | Solution 2 (weight %) |
| --- | --- | --- |
| HF | 0.51 | 0.04 |
| $HNO_3$ | 1.45 | 1.43 |
| $H_2O_2$ | 30.00 | 14.80 |
| $H_2O$ | 68.04 | 83.73 |
| ETCH RATE (nm/min.) | 435+/−150 | 112.5+/−37.5 |

A substrate was placed in each solution and the etch rate was determined by the amount of time necessary to completely remove portions of the PZT layer exposed by the photoresist mask. In each case, the endpoint of the PZT was determined by observing the initiation of bubbling in the etching solution due to the decomposition of hydrogen peroxide at the exposed platinum surface. The PZT etch rate in each solution was determined by dividing the PZT film thickness by the time required to remove the PZT film. The average etch rate and range of measurements for each solution is shown in Table I.

The ability to control the PZT etch rate to a desired low rate is a particular advantage of the invention. The low PZT etch rate coupled with the ability to detect the endpoint of the etch improves the quality of the etch. Therefore, unnecessary over-etching can be avoided and results in better PZT pattern definition.

Those skilled in the art recognize that the platinum etching solution and the dielectric etching solution can also be used in conjunction with dry etching processes to remove dry-etching residue from the surface of the substrate. For example, the dielectric etching solution can be used to clean the substrate surface after formation of the capacitor is complete. Additionally, the platinum etching solution can be used to remove platinum residue from the substrate surface after formation of the capacitor is complete. The cleaning process can be performed by providing a new mask to protect the capacitor, and simply immersing the etched substrate in the dielectric etching solution for a few seconds. As illustrated in FIG. 3, a cleaning mask 22 is defined to protect capacitor 14 prior to immersing substrate 10 in either the platinum etching solution or the dielectric etching solution.

An additional problem associated with ion milling is the redeposition of platinum during the ion milling process. During the high-energy ion milling process, platinum residue can redeposit on the edge of the PZT dielectric layer. The platinum residue can cause an electrical short between first and second electrodes 16 and 20. The platinum residue on the edge of the PZT dielectric material can result in a non-functional capacitor. In accordance with the invention, the platinum residue can be removed by a brief etch of 10 to 20 seconds in the platinum etching solution after an ion milling process. In this case, the original ion milling etch mask is retained to protect the platinum electrodes.

Thus, it, is apparent that there has been provided, in accordance with the invention, a process for fabricating a ferroelectric capacitor which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a variety of capacitor configurations and process sequences other than those described are possible. It is therefore intended to include within the invention all such variations and modifications as fall within the scope of the appended claims and equivalents thereof.

I claim:

1. A method for fabricating a ferroelectric capacitor in a semiconductor device comprising:
    providing a substrate having a first electrode layer disposed thereon;
    forming a ferroelectric layer overlying the first electrode;
    forming a second electrode layer overlying the ferroelectric layer;
    selectively etching the second electrode layer in a first aqueous solution including hydrochloric acid, nitric acid, and a metal etching compound having phosphoric acid, nitric acid, and acetic acid, wherein the ferroelectric layer is not substantially etched; and
    selectively etching the ferroelectric layer in a second aqueous solution including hydrogen peroxide, hydrofluoric acid, and nitric acid.

2. The process of claim 1, wherein the first aqueous solution comprises from about 55 to 79 weight % water, and from about 12 to 23 weight % hydrochloric acid, and from about 4 to 10 weight % nitric acid, and from about 5 to 12 weight % metal etching compound, wherein the metal etching compound includes about 60 to 80 weight % phosphoric acid, about 10 to 25 weight % acetic acid, about 0.1 to 5.0 weight % nitric acid, and water.

3. The process of claim 2, wherein the first aqueous solution is maintained at a temperature of about 70° to 80° C. during the etching process.

4. The process of claim 1, wherein the second aqueous solution comprises from about 0.02 to 0.7 weight % hydrofluoric acid, and and from about 1 to 5 weight % nitric acid, and from about 0 to 50 weight % hydrogen peroxide, and from about 44.3 to 98.98 weight % water.

5. The process of claim 1 further comprising the step of monitoring the selective etching of the ferroelectric compound to detect the evolution of gaseous reaction products signifying the endpoint of the selective etch.

6. A process for fabricating a ferroelectric capacitor in a semiconductor device comprising the steps of:

providing a substrate having a platinum layer and a crystallized ferroelectric layer, wherein the platinum layer lies over the substrate and the crystallized ferroelectric layer lies over the platinum layer;

forming a photoresist pattern on the platinum layer; and selectively etching the platinum layer in an aqueous solution including from about 55 to 79 weight % water, and from about 12 to 23 weight % hydrochloric acid, and from about 4 to 10 weight % nitric acid, and from about 5 to 12 weight % metal etching compound, wherein the metal etching compound has about 60 to 80 weight % phosphoric acid, about 10 to 25 weight % acetic acid, about 0.1 to 5.0 weight % nitric acid, and water, wherein the aqueous solution does not substantially etch the photoresist layer or the ferroelectric layer.

7. The process of claim 6 further comprising the step of exposing the platinum layer to a cleaning solution prior to selective etching the platinum layer, wherein the cleaning solution includes from about 3 to 12 weight % hydrogen peroxide, and from about 97 to 88 weight % water.

8. The process of claim 7, wherein the cleaning solution is maintained at a temperature of about 30° to 50° C.

9. The process of claim 6, wherein the aqueous solution is maintained at a temperature of about 70° to 80° C. during the etching process.

10. A process for fabricating a ferroelectric capacitor in a semiconductor device comprising the steps of:

providing a substrate having a platinum layer and a crystallized ferroelectric layer, wherein the platinum layer lies over the substrate and the crystallized ferroelectric layer lies over the platinum layer;

forming an etching mask on the ferroelectric layer;

selectively etching the ferroelectric layer in an aqueous solution including from about 0.02 to 0.7 weight % hydrofluoric acid, and from about 1 to 5 weight % nitric acid, and from about 1 to 50 weight % hydrogen peroxide, and from about 43.3 to 98.98 weight % water; and monitoring the selective etching process to detect the evolution of gaseous reaction products signifying the endpoint of the selective etch.

11. The process of claim 10, wherein the aqueous solution is maintained at a temperature of about 70° to 80° C. during the etching process.

12. A process for fabricating a ferroelectric capacitor in a semiconductor device comprising the steps of:

providing a substrate having a crystallized ferroelectric capacitor, wherein the crystallized ferroelectric capacitor includes a platinum layer and a crystallized ferroelectric layer, wherein the crystallized ferroelectric layer lies over the platinum layer;

etching the ferroelectric layer in a dry etching process selected from a group consisting of ion milling and plasma etching; and cleaning the surface of the substrate with an aqueous solution selected from the group consisting of a dielectric etching solution containing from about 0.02 to 0.7 weight % hydrofluoric acid, and from about 1 to 5 weight % nitric acid, and from about 1 to 50 weight % hydrogen peroxide, and from about 43.3 to 98.98 weight % water, and a platinum etching solution including from about 55 to 79 weight % water, and from about 12 to 23 weight % hydrochloric acid, and from about 4 to 10 weight % nitric acid, and from about 5 to 12 weight % metal etching compound, wherein the metal etching compound has about 60 to 80 weight % phosphoric acid, about 10 to 25 weight % acetic acid, about 0.1 to 5.0 weight % nitric acid, and water.

13. The process of claim 12 further comprising forming a mask to protect the ferroelectric capacitor prior to cleaning the substrate surface.

* * * * *